(12) United States Patent
Koishi et al.

(10) Patent No.: US 6,490,302 B1
(45) Date of Patent: Dec. 3, 2002

(54) SEMICONDUCTOR LASER CONTROL CIRCUIT AND LASER LIGHT SOURCE

(75) Inventors: Kenji Koishi, Sanda (JP); Kohjyu Konno, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 257 days.

(21) Appl. No.: 09/698,975

(22) Filed: Oct. 27, 2000

(30) Foreign Application Priority Data

Oct. 28, 1999 (JP) .......................................... 11-306691

(51) Int. Cl.[7] ............................................... H01S 3/00
(52) U.S. Cl. ................ 372/38.02; 372/38.1; 372/38.07; 372/29.015; 372/26; 250/205; 369/59
(58) Field of Search ......................... 372/38.02, 29.015, 372/29.014, 38.1, 26, 38.07; 369/59, 54, 116; 250/205, 206

(56) References Cited

U.S. PATENT DOCUMENTS

| | | | |
|---|---|---|---|
| 4,701,609 A | | 10/1987 | Koishi et al. |
| 4,771,431 A | * | 9/1988 | Nakazawa et al. ............. 372/38 |
| 4,799,224 A | * | 1/1989 | Bottacchi et al. ............. 372/38 |
| 5,127,015 A | * | 6/1992 | Chikugawa et al. .......... 372/38 |
| 5,490,126 A | | 2/1996 | Furumiya et al. |
| 5,636,194 A | | 6/1997 | Furumiya et al. |
| 5,706,116 A | * | 1/1998 | Sugata ......................... 372/38 |
| 6,324,197 B1 | * | 11/2001 | Suda ......................... 372/38.01 |

* cited by examiner

*Primary Examiner*—Leon Scott, Jr.
(74) *Attorney, Agent, or Firm*—Akin, Gump, Strauss, Hauer & Feld, L.L.P.

(57) ABSTRACT

A semiconductor laser control circuit of the invention can modulate a light power level among a plurality of set levels including a first level, a second level lower than the first level, and a third level lower than the first level but higher than the second level. The semiconductor laser control circuit includes: a circuit portion for generating a first signal based on a light power level actually detected by a light detector in a first period in which a light power level of laser radiation is to be modulated among the first level, the second level, and the third level; a circuit portion for generating a second signal based on a light power level actually detected by the light detector in a second period in which a light power level of the laser radiation is to be modulated between the first level and the second level; a circuit portion for generating a third signal based on a light power level actually detected by the light detector in a third period in which the light power level of the laser radiation is to be at the third level; and a signal processor for determining a light power level of the first level and a light power level of the second level by operation, based on the first to third signals. The light power level is adjusted based on an output of the signal processor.

20 Claims, 13 Drawing Sheets

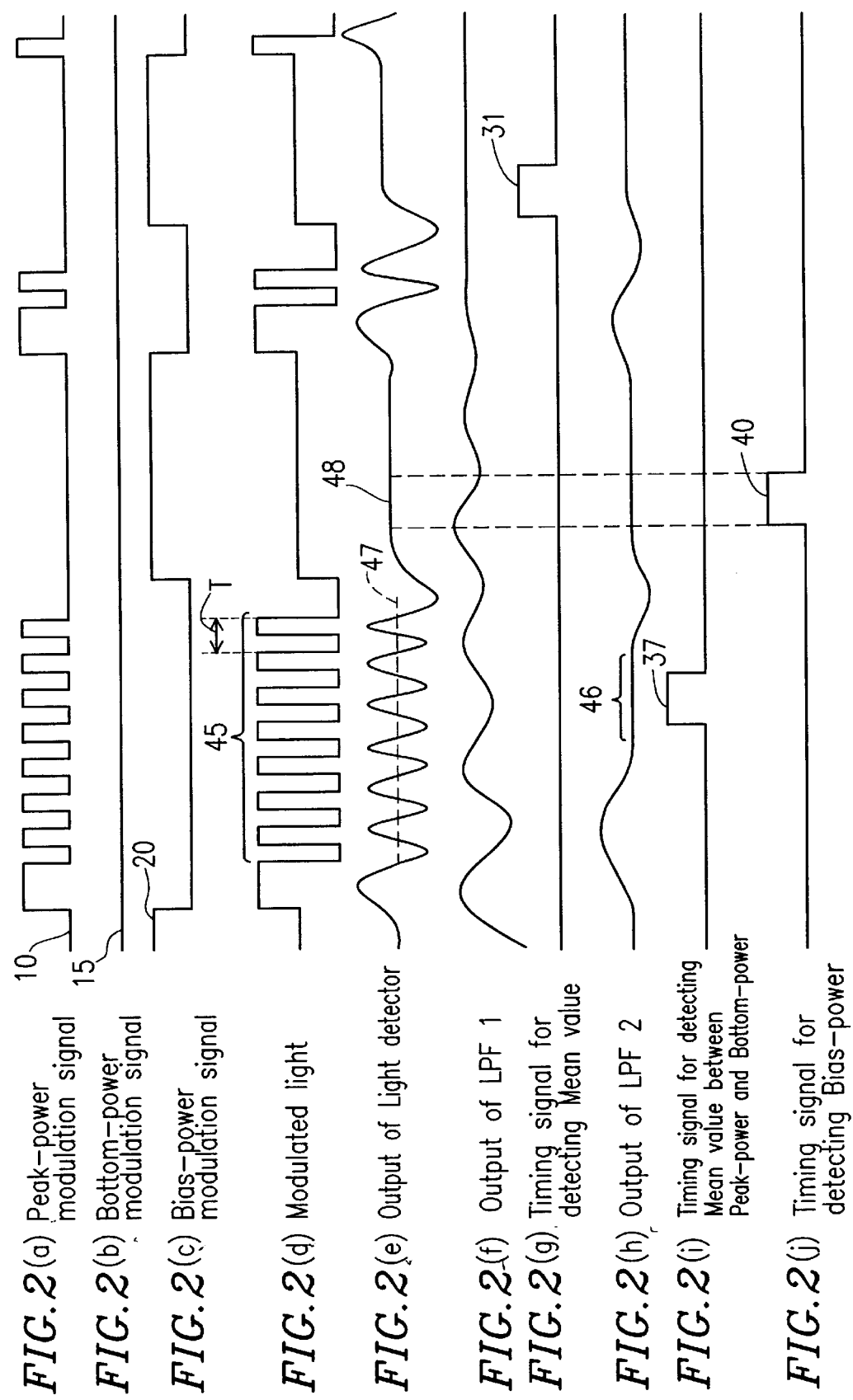

FIG.2(a) Peak-power modulation signal
FIG.2(b) Bottom-power modulation signal
FIG.2(c) Bias-power modulation signal
FIG.2(d) Modulated light
FIG.2(e) Output of Light detector
FIG.2(f) Output of LPF 1
FIG.2(g) Timing signal for detecting Mean value
FIG.2(h) Output of LPF 2
FIG.2(i) Timing signal for detecting Mean value between Peak-power and Bottom-power
FIG.2(j) Timing signal for detecting Bias-power FIG. 10(a) Peak-power modulation signal
FIG. 10(b) Bottom-power modulation signal
FIG. 10(c) Bias-power modulation signal
FIG. 10(d) Modulated light
FIG. 10(e) Output of Peak detection
FIG. 10(f) Output of Light detector
FIG. 10(g) Output of Bottom detection
FIG. 10(h) Modulated light after Power control

SEMICONDUCTOR LASER CONTROL CIRCUIT AND LASER LIGHT SOURCE

BACKGROUND OF THE INVENTION

The present invention relates to a semiconductor laser control circuit for adjusting a modulated laser power of each level to a target value when the output modulation of emitted laser radiation is performed among multi-value levels.

Examples of known recording mediums storing optically rewritable information thereon include phase-change storage media and magneto-optical recording media. In writing information onto a phase-change storage medium, an information layer of the medium is irradiated with a focused laser beam, thereby partially heating and fusing the information layer. The highest temperature the information layer can reach due to the heat applied thereto or the cooling process of the layer differs depending on the intensity of the laser radiation incident thereto. Thus, the optical characteristics of the information layer, such as the refractive index thereof, are locally modifiable by modulating the intensity of the laser radiation emitted. More specifically, if the intensity of the laser radiation is higher than a predetermined reference level, part of the information layer of the recording medium that has been irradiated with the radiation is rapidly cooled from an elevated temperature so as to be amorphized. If the intensity of the laser radiation is relatively low on the other hand, the irradiated part of the information layer of the recording medium is gradually cooled from an intermediate to high temperature and therefore crystallized. The amorphized part of the information layer of the recording medium is called a "mark", while the crystallized part is called a "space". That is to say, the mark and space have mutually different optical characteristics in terms of their refractive indices, for example. Accordingly, binary data is storable in the information layer of the recording medium by arranging the marks and spaces in a specific pattern. As used herein, the laser radiation for use in information recording will be called "write radiation".

In reading out information stored on a phase-change storage medium, the information layer thereof is irradiated with a laser radiation beam with an intensity low enough to not cause any phase change in the information layer and a radiation beam, which is reflected from the information layer, is detected. As used herein, the laser radiation for use in information readout will be called "readout radiation". The mark, or the amorphized part of the information layer of the recording medium, has a relatively low reflectance, while the space, or the crystallized part of the information layer of the recording medium, has a relatively high reflectance. Accordingly, by recognizing the difference in the amount of the radiation reflected from the mark and space, a read signal can be obtained.

Information can be recorded on such a recording medium by a pulse position modulation (PPM) or pulse width modulation (PWM) technique. A recording technique which uses PWM is also called a "mark edge recording" technique.

According to the PPM recording technique, marks are recorded with the space between the marks varied, and information to be written is assigned to positions of the marks. Each of these marks is represented as a pulse with a relatively short, constant pulse width. In contrast, according to the PWM technique, marks of various lengths are recorded with the space between the marks also varied, and information to be written is represented by edge positions of the marks and spaces with a variety of lengths. Generally speaking, the density of the information recorded can be higher with the PWM technique than with the PPM technique.

In performing a PWM recording, longer marks are recorded compared to the PPM recording. If long marks are recorded on a phase-change storage medium, however, the widths of those marks might be non-uniform, because the information layers of media of this type may accumulate and dissipate heat in various manners and their recording sensitivities may be greatly different from each other. It is also known that if the information layer is continuously irradiated with radiation for a long time to record a long mark therein, then the second half of the long mark is likely to increase its width because too much heat is accumulated in that part. To avoid such an unfavorable increase in mark width, a write strategy, by which the radiation is irradiated for recording purposes as a greater number of pulses each with an even short width, was adopted. Methods and apparatuses of this type, that is to say, multi-pulse mark recording methods and apparatuses, are disclosed in U.S. Pat. Nos. 5,490,126 and 5,636,194, for example.

In order to write data onto a recording medium without any error, it is necessary to maintain an intensity of laser radiation with which the recording medium is irradiated at an appropriate level. Such an appropriate level varies depending on the kind of a recording medium. After the recording medium is inserted into a recording/reproducing apparatus, the optimization of the intensity or power level of laser radiation is automatically performed. In order to maintain the power levels of the modulated laser radiation at the target levels, however, it is necessary to always or periodically monitor the power levels of the modulated laser radiation, and to control a laser light source (a semiconductor laser) so that the optical power cannot shift from a target value.

Hereinafter, with reference to FIG. 9 and FIGS. 10(a) to (h), a prior-art semiconductor laser control circuit will be described.

FIG. 9 shows a configuration of a prior-art semiconductor laser control circuit. The control circuit controls a current for driving a semiconductor laser 1, so that laser radiation having a pulse waveform shown in FIG. 10(d) can be emitted from the semiconductor laser 1.

An intensity (power level) of the laser radiation emitted from the semiconductor laser 1 is detected and converted into a current signal by a monitoring light detector 2. The current signal is then converted into a voltage signal by a current-to-voltage converter 3. The voltage signal is input into a peak-power detector 4, a bottom-power detector 5, and a sample-and-hold circuit 6 shown in FIG. 9.

The peak-power detector 4 detects an envelope of a peak-power level in a wave-form of the input voltage signal. The bottom-power detector 5 detects an envelope of a bottom-power level. The sample-and-hold circuit 6 detects a bias-power level of laser radiation.

Outputs of the peak-power detector 4, the bottom-power detector 5, and the sample-and-hold circuit 6 are input into peak-power current controller 7, bottom-power current controller 12, and bias-power current controller 17, respectively.

The peak-power current controller 7 compares the output of the peak-power detector 4 with a predetermined reference peak-power voltage 8, and controls a value of a current flowing out of a peak-power current source 9. The current is supplied to the semiconductor laser 1 via a switch 11 which is opened and closed in accordance with a peak-power modulation signal 10 shown in FIG. 10(a).

The bottom-power current controller 12 compares the output of the bottom-power detector 5 with a predetermined reference peak-power voltage 13, and controls a value of a current flowing out of a bottom-power current source 14. The current is supplied to the semiconductor laser 1 via a switch 16 which is opened and closed in accordance with a bottom-power modulation signal 15 shown in FIG. 10(b).

The bias-power current controller 17 compares the output of the bias-power sample-and-hold circuit 6 with a predetermined reference bias-power voltage 18, and controls a value of a current flowing out of a bias-power current source 19. The current is supplied to the semiconductor laser 1 via a switch 21 which is opened and closed in accordance with a bias-power modulation signal 20 shown in FIG. 10(c).

The semiconductor laser 1 is driven by a combination of currents supplied to the semiconductor laser from the peak-power current source 9, the bottom-power current source 14, and the bias-power current source 19. The semiconductor laser 1 emits laser radiation having a waveform modulated among three levels, as shown in FIG. 10(d).

The above-mentioned control circuit involves a problem in that if a frequency of a modulation signal becomes higher, a peak-power and a bottom-power of modulated light pulses cannot be accurately detected, so that the peak-power and the bottom-power of the light pulses are deviated from their target values. Hereinafter the problem will be described.

In terms of prices, a light detector which can response at extremely high speed is not mounted on an optical head which is used in a usual optical disk recording apparatus. Thus, in the case of a light detector used in a usual optical disk recording apparatus, when a clock frequency of a modulation signal is higher, it becomes difficult to ensure frequency characteristics by which the modulation light pulse waveform in writing can be faithfully detected.

In order to enhance frequency characteristics of the light detector 2, generally, an expensive light detector with superior frequency characteristics is used, and it is necessary to focus and launch laser radiation to be monitored onto and into the light detector. The frequency characteristics of the light detector used in a usual optical disk recording apparatus are, however, not sufficient.

In the case where the frequency characteristics of the light detector 2 are insufficient, the intensity of laser radiation is detected by the light detector 2, and output from the light detector 2 as a signal having a waveform shown in FIG. 10(f). The waveform shown in FIG. 10(f) is that of a voltage signal output from the current-to-voltage converter 3. The signal waveform is substantially the same before and after the current-to-voltage converter 3.

It is understood by the comparison between FIGS. 10(d) and (f) that the output waveform of the light detector 2 does not precisely reproduce the intensity waveform of laser radiation, but has a shape obtained by blunting the intensity waveform of laser radiation.

If peak detection is performed for such an output waveform, the obtained peak-power exhibits a level of FIG. 10(e). On the other hand, if bottom detection is performed for the output waveform, the obtained bottom-power exhibits a level of FIG. 10(g). FIG. 10(e) shows an output of the peak-power detector 4, and FIG. 10(g) shows an output of the bottom-power detector 5.

If the light detector 2 has the frequency characteristics required for faithfully reproducing the waveform shown in FIG. 10(d), a peak detection output at a level 23 and a bottom detection output at a level 24 are obtained. In other words, in the case where the light detector 2 has sufficient frequency characteristics, a level difference between a peak-power and a bottom-power should have a magnitude shown by the reference numeral "25". In actuality, since the frequency characteristics of the light detector 2 are insufficient, it is judged that the level difference has a relatively small magnitude shown by the reference numeral "26".

When a signal having a level of FIG. 10(e) is input into the peak-power current controller 7, it is erroneously recognized that a peak-power which is excessively smaller than the peak-power 23 of the actual light pulse is detected. As a result, since the control is performed so as to increase the peak-power, the peak-power of the modulation light pulse after the power control is larger than the reference peak-power 27, as shown in FIG. 10(h). FIG. 10(h) shows an intensity waveform of laser radiation after a light power level control of laser radiation is performed by the control circuit.

When a signal having a level of FIG. 10(g) is input into the bottom-power current controller 12, it is erroneously recognized that a bottom-power which is larger than the bottom-power 24 of the actual light pulse is detected. As a result, since the control is performed so as to lower the bottom-power, the bottom-power of the modulation light pulse after the power control is smaller than the reference bottom-power 28, as shown in FIG. 10(h).

If the frequency of the modulation signal becomes higher, the frequency characteristics of the light detector are insufficient. As a result, the peak-power level and the bottom-power level of the modulated light pulse waveform cannot be precisely detected. This results in the difficulty in precise control of a semiconductor laser, and there arises a problem in that the fluctuation or error of the peak-power level and the bottom-power level of the laser light is increased.

SUMMARY OF THE INVENION

The invention provides a semiconductor laser control circuit which can precisely control a peak-power and a bottom-power of modulated light pulses to predetermined levels, even if a light detector has insufficient frequency characteristics.

A semiconductor laser control circuit of the invention can modulate a light power level among a plurality of set levels including a first level, a second level lower than the first level, and a third level lower than the first level but higher than the second level, and the semiconductor laser control circuit includes: a first circuit portion for generating a first signal based on a light power level actually detected by a light detector in a first period in which a light power level of laser radiation is to be modulated among the first level, the second level, and the third level; a second circuit portion for generating a second signal based on a light power level actually detected by the light detector in a second period in which a light power level of the laser radiation is to be modulated between the first level and the second level; a third circuit portion for generating a third signal based on a light power level actually detected by the light detector in a third period in which the light power level of the laser radiation is to be at the third level; and a signal processor for determining a light power level of the first level and a light power level of the second level by operation, based on the first to third signals, wherein the light power level is adjusted based on an output of the arithmetic circuit portion.

A semiconductor laser control circuit of the invention can modulate a light power level between a first level and a second level lower than the first level, and the semiconductor laser control circuit includes: a first circuit portion for generating a signal indicating an average value of light intensities actually detected by a light detector in a period in which a light power level is to be modulated between the first level and the second level; a circuit portion for generating a signal indicating a light power level actually detected by the light detector in a period in which the light power level is to be at the second level; and a signal processor for obtaining a light power level of the first level, based on the two signals, wherein a light power level of laser radiation is adjusted based on an output of the arithmetic circuit portion.

A laser light source of the invention includes: the above-described semiconductor laser control circuit; and a semiconductor laser driven by the control circuit.

An apparatus of the invention includes: the above-described semiconductor laser control circuit; a semiconductor laser driven by the control circuit; and an optical system for irradiating a recording medium with laser radiation emitted from the semiconductor laser.

BRIEF DESCRIPTION OF THE SEVERAL VIEWS OF THE DRAWINGS

The foregoing summary as well as the following detailed description of the preferred embodiments of the invention will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings:

FIGS. 2(a)–(j) illustrate a signal waveform chart of the semiconductor laser control circuit of Embodiment 1 according to the invention: FIG. 2(a) shows a peak-power modulation signal waveform 10; FIG. 2(b) shows a bottom-power modulation signal waveform 15; FIG. 2(c) shows a bias-power modulation signal waveform 20; FIG. 2(d) shows an output light waveform of the semiconductor laser 1; FIG. 2(e) shows a voltage waveform output from the current-to-voltage converter 3; FIG. 2(f) shows an output waveform from the first low-pass filter 30; FIG. 2(g) shows a waveform of a timing signal 31 for sampling and holding the output of the first low-pass filter 30; FIG. 2(h) shows an output waveform of the second low-pass filter 35; FIG. 2(i) shows a waveform of the timing signal 37 for sampling and holding the output of the second low-pass filter 35; FIG. 2(j) shows a waveform of the timing signal 40 for sampling and holding the output of the current-to-voltage converter 3;

FIG. 4(a) shows a peak-power modulation signal waveform 10; FIG. 4(b) shows a bottom-power modulation signal waveform 15; FIG. 4(c) shows a bias-power modulation signal waveform 20; FIG. 4(d) shows an output light waveform of the semiconductor laser 1; FIG. 4(e) shows a voltage waveform output from the current-to-voltage converter 3; FIG. 4(f) shows an output waveform from the first low-pass filter 30; FIG. 4(g) shows a waveform of a timing signal 31 for sampling and holding the output of the first low-pass filter 30; FIG. 4(h) shows an output waveform of the second low-pass filter 55; FIG. 4(i) shows a waveform of the timing signal 37 for sampling and holding the output of the second low-pass filter 55; FIG. 4(j) shows an output 59 of a peak hold circuit 56; FIG. 4(k) shows a waveform of the timing signal 40 for sampling and holding the output of the current-to-voltage converter 3;

FIG. 6(a) shows a peak-power modulation signal waveform 10; FIG. 6(b) shows a bottom-power modulation signal waveform 15; FIG. 6(c) shows a bias-power modulation signal waveform 20; FIG. 6(d) shows an output light wave-form of the semiconductor laser 1; FIG. 6(e) shows a voltage waveform output from the current-to-voltage converter 3; FIG. 6(f) shows an output waveform from the first low-pass filter 30; FIG. 6(g) shows a waveform of a timing signal 31 for sampling and holding the output of the first low-pass filter 30; FIG. 6(h) shows an output waveform of the band-stop filter 60; FIG. 6(i) shows an output waveform of the low-pass filter 61; FIG. 6(j) shows a waveform of a timing signal 37 for sampling and holding the output of the low-pass filter 61; FIG. 6(k) shows a waveform of the timing signal 40 for sampling and holding the output of the current-to-voltage converter 3;

FIG. 8(a) shows a peak-power modulation signal waveform 10; FIG. 8(b) shows a bottom-power modulation signal waveform 15; FIG. 8(c) shows a bias-power modulation signal waveform 20; FIG. 8(d) shows an output light waveform of the semiconductor laser 1; FIG. 8(e) shows a voltage waveform output from the current-to-voltage converter 3; FIG. 8(f) shows an output waveform from the first low-pass filter 30; FIG. 8(g) shows a waveform of a timing signal 31 for sampling and holding the output of the first low-pass filter 30; FIG. 8(h) shows an output waveform of the full wave rectifier 62; FIG. 8(i) shows an output waveform of the low-pass filter 63; FIG. 8(j) shows a waveform of a timing signal 37 for sampling and holding the output of the low-pass filter 63; FIG. 8(k) shows a waveform of the timing signal 40 for sampling and holding the output of the current-to-voltage converter 3;

FIG. 10(a) shows a peak-power modulation signal waveform 10; FIG. 10(b) shows a bottom-power modulation signal waveform 15; FIG. 10(c) shows a bias-power modulation signal waveform 20; FIG. 10(d) shows an output light waveform of the semiconductor laser 1; FIG. 10(e) shows an output of peak detection; FIG. 10(f) shows an output of light detector; FIG. 10(g) shows an output of bottom detection; FIG. 10(h) shows a modulated light after power control;

Figure 1:
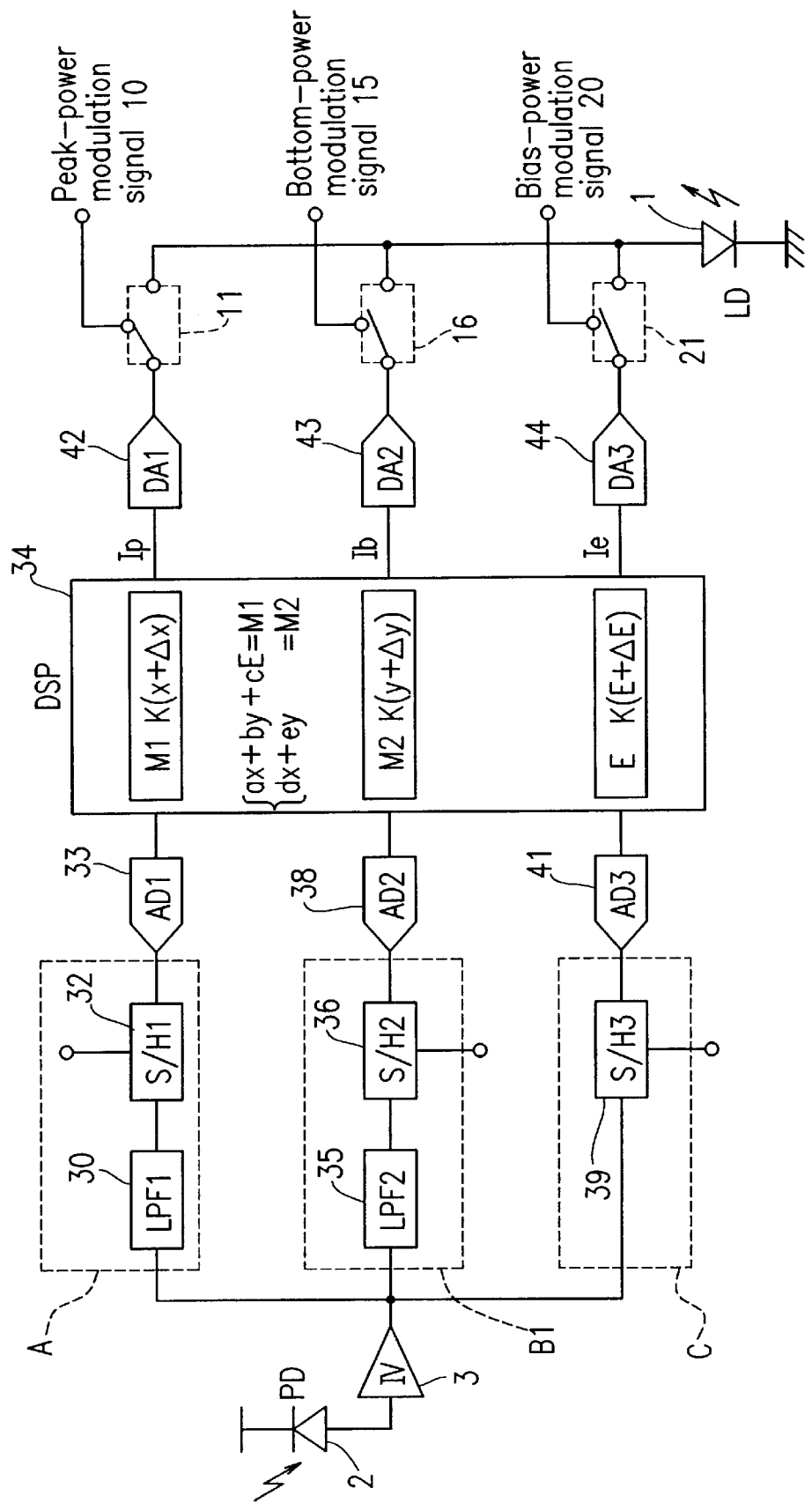
FIG. 1 is a block diagram illustrating a configuration of a semiconductor laser control circuit portion of Embodiment 1 according to the invention.

DETAILED DESCRIPTION OF THE INVENTION (Embodiment 1)

Hereinafter, a first embodiment of the semiconductor laser control circuit according to the invention will be described with reference to FIG. 1 and FIGS. 2(a)–(j).

The semiconductor laser control circuit of this embodiment controls a driving current of a semiconductor laser, and modulates an intensity or light power of light emitted from the semiconductor laser among three set levels including a first level (a peak-power level), a second level (a bottom-power level), and a third level (a bias-power level). The bottom-power level is lower than the peak-power level. The bias-power level is lower than the peak-power level but higher than the bottom-power level. A typical waveform of the output power of a semiconductor laser 1 is shown in FIG. 2(d). FIG. 2(d) shows an output light waveform during a marking period in which a light power level is modulated between the peak-power level and the bottom-power level for mark writing (a period in which a multi-pulse portion 45 is generated), and a certain period including an erasing period in which the light power level is maintained at the bias-power level. In the marking period in which the light power is modulated between the peak-power level and the bottom-power level, a mark having a length corresponding to the period is written onto a recording medium. On the other hand, in the period in which the light power level is maintained at the bias-power level, the mark recorded on the recording medium is erased.

In a sufficiently long period including the above-mentioned two kinds of periods, the light power level is modulated among three set levels including a peak-power level ($P_p$), a bottom-power level ($P_b$), and a bias-power level ($P_E$). As used herein, the sufficiently long period is referred to as a "first period", the period in which a mark is written onto the recording medium is referred to as a "second period", and the period in which the mark on the recording medium is erased is referred to as a "third period".

The semiconductor laser control circuit in this embodiment includes a circuit component A for generating a first signal based on an intensity of laser radiation actually detected by the light detector 2 in the first period, a circuit component B1 for generating a second signal based on an intensity of laser radiation actually detected by the light detector 2 in the second period, and a circuit component C for generating a third signal based on an intensity of laser radiation actually detected by the light detector 2 in the third period.

In this embodiment, laser light intensities of a peak-power level and a bottom-power level are determined by a digital signal processor (DSP) 34, based on the first to third signals. The intensity of laser radiation is adjusted based on an output of the digital signal processor 34.

Hereinafter the configuration of the semiconductor laser control circuit will be described in more detail.

The light detector 2 constituted by a photodiode (PD) and the like receives part of laser radiation emitted from the semiconductor laser 1, and generates a current signal in accordance with the incident light intensity. In a preferable configuration, laser radiation with high intensity emitted from an end face of a semiconductor laser is incident on a recording medium, and laser radiation with low intensity (monitor light) emitted from the other end face of the semiconductor laser is incident on a light receiving face of the light detector 2.

The current-to-voltage (IV) converter 3 converts the current signal output from the light detector 2 into a voltage signal. The voltage signal has a waveform which is similar to that of the current signal output from the light detector 2, and the shape is shown in FIG. 2(e). The voltage signal has a shape which is obtained by slightly smoothing the waveform of output laser radiation of FIG. 2(d) in accordance with the response characteristics of the light detector 2.

In this embodiment, the peak-power level and the bottom-power level in the intensity of modulated laser radiation are obtained from the voltage waveform by an inventive method quite different from that used in the prior art, and the driving of the semiconductor laser can be controlled so that the output intensity of laser radiation becomes closer to each target level based on the obtained respective levels.

The voltage signal output from the current-to-voltage converter 3 is input into the circuit component A, the circuit component B1, and the circuit component C in parallel, as shown in FIG. 1.

The circuit component A includes a first low-pass filter (LPF1) 30 and a first sample-and-hold circuit (S/H1) 32.

The low-pass filter 30 receives the output of the current-to-voltage converter 3. Frequency components which are equal to or lower than a predetermined frequency (a cut-off frequency) are transmitted therethrough, and higher frequency components which exceed the cut-off frequency are attenuated. As a result, the low-pass filter 30 outputs a signal in which higher frequency components of the input signal are suppressed.

The sample-and-hold circuit 32 has functions for sampling the signal output from the low-pass filter 30 in a relatively short interval, and then holding the signal at the sampled value in a relatively long interval. The sample-and-hold circuit 32 performs the sampling of the signal at a timing (an average value detection timing) at which the output of the low-pass filter 30 becomes stable and is converged on a specific value (an average value of the input signal). The output of the sample-and-hold circuit 32 indicates an average value M1 in the first period of the output from the light detector 2. The average value M1 is input into a first AD converter (AD1) 33, and converted into a digital data signal M1. The digital data signal M1 is input into the digital signal processor (DSP) 34. The sampling by the sample-and-hold circuit 32 is performed at a timing when a timing signal 31 generated by an S/H timing generating circuit is input into the sample-and-hold circuit 32. The S/H timing generating circuit operates based on a signal sent out of a write-pulses generator. The write-pulses generator has a function for generating signals shown in FIGS. 2(a)–(c), based on an output of a modulator for encoding data to be written.

The cut-off frequency of the first low-pass filter 30 is selected, as described above, so as to smooth the peak-power, the bottom-power, and the bias-power of the input voltage signal, and to output a signal having a magnitude corresponding to the average value M1 thereof. Specifically, the cut-off frequency is determined in the following manner.

When a width of one pulse included in the multi-pulse portion 45 is T seconds, a cut-off frequency $fc_1$ of the first low-pass filter 30 is selected so as to be included in the range of 1/(100T) to 1/(50T), for example. In this embodiment, approximately, T=40 nanoseconds, so that the cut-off frequency $fc_1$ of the first low-pass filter 30 is about 250 to 500 kHz.

The circuit component B1 includes a second low-pass filter (LPF2) 35 and a second sample-and-hold circuit (S/H2) 36. The low-pass filter 35 receives the output of the current-to-voltage converter 3, and outputs a signal component in which frequency components equal to or higher than a predetermnined frequency are suppressed. The sample-and-hold circuit 36 has functions for sampling the signal output from the low-pass filter 35 in a relatively short interval, and then holding the signal at the sampled value in a relatively long interval. The sample-and-hold circuit 36 performns the sampling of the signal at a timing (an averages value detection timing) at which the output of the low-pass filter 35 becomes stable and is converged on a specific value. The sampling by the sample-and-hold circuit 36 is performed at a timing when a timing signal 37 generated by the S/H timing generating circuit is input into the sample-and-hold circuit 36. The output of the sample-and-hold circuit 36 indicates an average value M2 in the second period of the output from the light detector 2. The average value M2 is input into a second AD converter (AD2) 38, and converted into a digital data signal M2. The digital data signal M2 is input into the arithmetic circuit 34.

The second period corresponds to a period of a repetitive portion of pulses of identical cycles (the multi-pulse portion 45), as shown in FIG. 2(d). The cut-off frequency of the second low-pass filter 35 is selected so that the output thereof indicates the average value M2 of the multi-pulse portion 45. A cut-off frequency $fc_2$ of the second low-pass filter 35 is set to be about 1/(3T).

The circuit component C includes a third sample-and-hold circuit (S/H3) 39 for sampling and holding the voltage signal output from the current-to-voltage converter 3. The sample-and-hold circuit 39 performs the sampling and holding at a timing (a bias-power detection timing) at which a bias-power level of light power level becomes stable and is converged on a specific value (a bias-power). The sampling by the sample-and-hold circuit 39 is performed at a timing when a timing signal 40 generated by the S/H timing generating circuit is input into the sample-and-hold circuit 39. The output of the third sample-and-hold circuit 39 indicates a value E in the third period of the output from the light detector 2. The output of the third sample-and-hold circuit 39 is input into a third AD converter (AD3) 40, and converted into a digital data signal E. The digital data signal E is also input into the signal processor 34.

If a noise or the like is removed from an output of the third sample-and-hold circuit 39 so that the output is further stabilized, a more precise bias-power level can be obtained. For this purpose, a band restriction filter such as a low-pass filter may be inserted in a preceding stage of the third sample-and-hold circuit 39.

Appropriate correction may be performed in the signal processor 34 with respect to the data input into the signal processor 34 from the first AD converter 33, the second AD converter 38, and the third AD converter 41. By such data correction, an offset voltage in the low-pass filter or the sample-and-hold circuit can be compensated for, and bad influences by such frequency characteristics can be reduced. In addition, the influence by residual ripple of the output waveform can be eliminated.

The signal processor 34 in this embodiment is configured as a digital signal processor (DSP) for performing signal processing for digital data in accordance with previously stored software programs. The signal processor 34 determines a peak current value Ip, a bottom current value Ib, and a bias current value Ie to be supplied to the semiconductor laser 1 from the three kinds of input digital data, and outputs the respective current data.

The peak current value Ip output from the signal processor 34 is input into a first DA converter 42, and converted into an analog current value. The peak current value Ip is supplied to the semiconductor laser 1 via a first switch 11 which is opened and closed in accordance with a peak-power modulation signal 10.

The bottom current value Ib output from the signal processor 34 is input into a second DA converter 43, and converted into an analog current value. The bottom current value Ib is supplied to the semiconductor laser 1 via a second switch 16 which is opened and closed in accordance with a bottom-power modulation signal 15.

The data of bias current value Ie output from the signal processor 34 is input into a third DA converter 44, and converted into an analog current value. The analog current value is input into a third switch 21. The switch 21 performs its switching to a pulse current, so as to similarly drive the semiconductor laser 1. The bias current value Ie is supplied to the semiconductor laser 1 via the third switch 21 which is opened and closed in accordance with a bias-power modulation signal 20.

Next, with reference to FIGS. 2(a)–(j), an operation of the circuit shown in FIG. 1 will be described in detail.

FIG. 2(a) shows a peak-power modulation signal waveform 10 which varies between a "Low" level and a "High" level. When the peak-power modulation signal waveform 10 is at the "High" level, the switch 11 shown in FIG. 1 is in a closed state. In this condition, a current defining a peak-power level is supplied to the semiconductor laser 1 via the switch 11.

FIG. 2(b) shows a bottom-power modulation signal waveform 15 which originally varies between a "Low" level and a "High" level. FIG. 2(b) shows a condition in which the bottom-power modulation signal waveform 15 is at the "High" level. The bottom-power modulation signal waveform 15 reaches the "High" level at a timing for driving a light pulse at a light power level equal to or higher than the light power level of the bottom-power. When the bottom-power modulation signal waveform 15 is at the "High" level, the switch 16 shown in FIG. 1 is in a closed state. In this condition, a current defining a bottom-power level is supplied to the semiconductor laser 1 via the switch 16. The bottom-power modulation signal waveform 15 is at the "High" level in an information writing mode, and at the "Low" level in a read-out mode.

FIG. 2(c) shows a bias-power modulation signal waveform 20 which varies between a "Low" level and a "High" level. When the bias-power modulation signal waveform 20 is at the "High" level, the switch 21 shown in FIG. 1 is in a closed state. In this condition, a current defining a bias-power level is supplied to the semiconductor laser 1 via the switch 21. The bias-power modulation signal waveform 20 is at the "High" level only when the peak-power modulation signal waveform 10 is at the "Low" level. The peak-power modulation signal waveform 10 is varied to the "High" level only when the bias-power modulation signal waveform 20 is at the "Low" level.

FIG. 2(d) shows an output light waveform of the semiconductor laser 1 driven by the combination of the three kinds of modulation signals.

FIG. 2(e) shows a voltage waveform output from the current-to-voltage converter 3. The voltage waveform has a shape obtained by blunting the actual output light waveform in accordance with the response characteristics of the light detector 2. In FIG. 2(e), a level designated by the reference numeral "47" corresponds to an average value of the peak-power and the bottom-power. A level designated by the reference numeral "48" corresponds to a value of the bias-power.

FIG. 2(f) shows an output waveform from the first low-pass filter 30. In a sufficiently long interval (the first period)

in which the output of the first low-pass filter 30 becomes stable), the following equations (1) and (2) are established when a probability of the peak-power is a, a probability of the bottom-power is b, a probability of the bias-power is c, a light power level of the peak-power level actually detected by the light detector is x, a light power level of the bottom-power level is y, and a light power level of the bias-power level is E:

$$a+b+c=1 \quad \text{(Equation 1)}$$

$$ax+by+cE=M1 \quad \text{(Equation 2)}$$

where the value M1 is an average value of light intensities in the first period. The output of the first low-pass filter 30 in which higher frequency components are flattened indicates a level corresponding to the average value M1.

In the case where the data before the modulation coding is constituted by substantially random signals, it is possible to calculate a probability of each code. Based on the rules for assigning each code to a light modulation pulse string for driving the laser, the probabilities a, b, and c can be obtained from the probabilities of respective codes.

Especially, in the case where the sign includes a specific pattern (a pattern in which a mark of a 4T signal and a space is repeated, for example), the probability of the pattern is easily understood. Thus, based on the rule for assigning each code to a light modulation pulse string for driving the laser, the probabilities a, b, and c can be easily calculated.

FIG. 2(g) shows a waveform of a timing signal 31 for sampling and holding the output of the first low-pass filter 30, when the output thereof is converged and becomes stable.

In the case where the light pulse is modulated in a random manner, at the time when or after the output of the first low-pass filter 30 is converged and becomes stable, the sampling and holding can be performed at any arbitrary timing. On the contrary, in the case where an interval in which light pulses are modulated in a specific pattern exists and an average value of a peak-power, a bottom-power, and a bias-power is detected in a predetermined interval of light pulses only constituted by the specific pattern portion, the sampling and holding may be performed at a timing when an average value as the output of the first low-pass filter 30 in the predetermined interval of the specific pattern is converged and becomes stable.

FIG. 2(h) shows an output waveform of the second low-pass filter 35. In a multi-pulse portion 45, the light power level is modulated between the peak-power level and the bottom-power level. The number of pulses in the multi-pulse portion is determined in accordance with the length of a mark to be written. A width of each pulse and a pulse interval in the multi-pulse portion 45 have set magnitudes, so that the probabilities of the peak-power and the bottom-power in the multi-pulse portion are easily obtained. When a probability of the peak-power in the multi-pulse portion is d, and a probability of the bottom-power is e, the following equations (3) and (4) are established:

$$d+e=1 \quad \text{(Equation 3)}$$

$$dx+ey=M2 \quad \text{(Equation 4)}$$

where x and y represent a light power level of the peak-power level and a light power level of the bottom-power level, respectively, which are actually detected by the light detector.

The value M2 is an average value of the light intensities in the second period. In a period (the second period) 46 in which the output of the second low-pass filter 35 is stable, the output of the second low-pass filter 35 indicates a level corresponding to the value M2. The value M2 corresponds to a level indicated by the reference numeral "47" in FIG. 2(e).

When the multi-pulse portion 45 has a repetitive periodic waveform, the peak-power probability d and the bottom-power probability e of the multi-pulse portion 45 are easily obtained by the duty ratio of the pulse trains. If the multi-pulse portion 45 does not have the repetitive periodic waveform, the rule of transformation into a pulse string for modulating laser light is pursued.

FIG. 2(i) shows a waveform of the timing signal 37 for sampling and holding the output of the second low-pass filter 35, when the output thereof is converged and becomes stable.

FIG. 2(j) shows a waveform of the timing signal 40 for sampling and holding the output of the current-to-voltage converter 3, when the output thereof is converged and becomes stable at the level 48 corresponding to the bias-power level.

Figure 11:
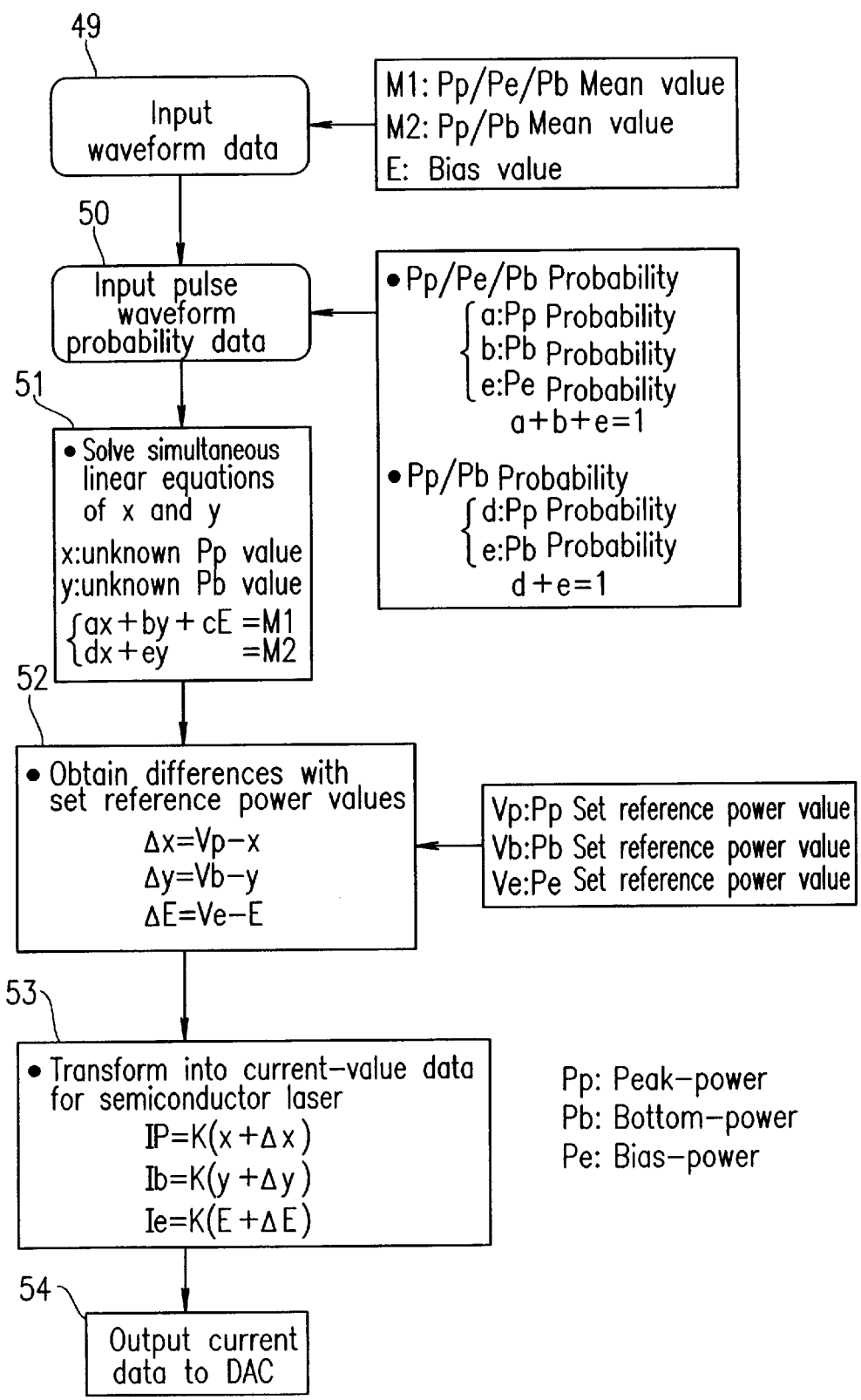
FIG. 11 is an arithmetic operation flowchart of a signal processor constituting a semiconductor laser control circuit.

Next, with reference to FIG. 11, the arithmetic operation flow by the signal processor 34 will be described.

First, as described above, digital data indicating the values M1, M2, and E are input into the signal processor 34 (Step 49). Then, the probabilities a, b, c, d, and e are input (Step 50).

When the values x and y are unknown, the aforementioned equations (2) and (4) constitute the following simultaneous linear equations:

$$ax+by+cE=M1 \quad \text{(Equation 2)}$$

$$dx+ey=M2 \quad \text{(Equation 4)}$$

Since the probabilities a, b, c, d, and e obtained from the encoding rules, and the values M1, M2, and E obtained by measurement are known, only x and y are unknown, so that the simultaneous equations can be solved. In Step 51, the simultaneous equations are solved, so as to obtain the values x and y.

The thus-obtained values x and y and the measured value E are compared with predetermined set reference values, so that difference values $\Delta x$, $\Delta y$, and $\Delta E$ are calculated (Step 52). Specifically, the following equations are established when a target value (a set reference value) of the peak-power level is Vp, a target value (a set reference value) of the bottom-power level is Vb, and a target value (a set reference value) of the bias-power level is Ve:

$$\Delta x=Vp-x \quad \text{(Equation 5)}$$

$$\Delta y=Vb-y \quad \text{(Equation 6)}$$

$$\Delta E=Ve-E \quad \text{(Equation 7)}.$$

In Step 53, from the difference values $\Delta x$, $\Delta y$, and $\Delta E$ which are obtained by the above-mentioned arithmetic operations, current-value data to be transmitted to the semiconductor laser 1 are determined by using the following equations (8) to (10):

$$Ip=K(x+\Delta x) \quad \text{(Equation 8)}$$

$$Ib=K(y+\Delta y) \quad \text{(Equation 9)}$$

$$Ie=K(E+\Delta E) \quad \text{(Equation 10)}$$

where K is a current converting coefficient, Ip is peak-power current data, Ib is bottom-power current data, and Ie is bias-power current data.

In Step 54, the peak-power current data Ip, the bottom-power current data Ib, and the bias-power current data Ie are output to the first DA converter 42, the second DA converter 43, and the third DA converter 44, respectively.

As described above, according to this embodiment, even in the case where the frequency characteristics of the light detector are insufficient, if the cut-off frequency of the low-pass filter is appropriately selected, an average value in a predetermined interval of a received-light waveform, an average value of the peak-power and the bottom-power in the multi-pulse interval portion can be detected. Based on the two kinds of average values, the peak-power and the bottom-power of the received-light wave-form can be obtained by operation. Thus, it is possible to accurately control the peak-power and the bottom-power of the light pulse to target levels.

The light power levels of the light pulse in this embodiment are constituted by three levels of the peak-power, the bottom-power, and the bias-power. The invention can be applied to the case where three or more levels are included in the light power levels of the light pulse.

(Embodiment 2)

A second embodiment of the semiconductor laser control circuit according to the present invention will be described with reference to FIG. 3 and FIGS. 4(a) to (k).

Figure 3:
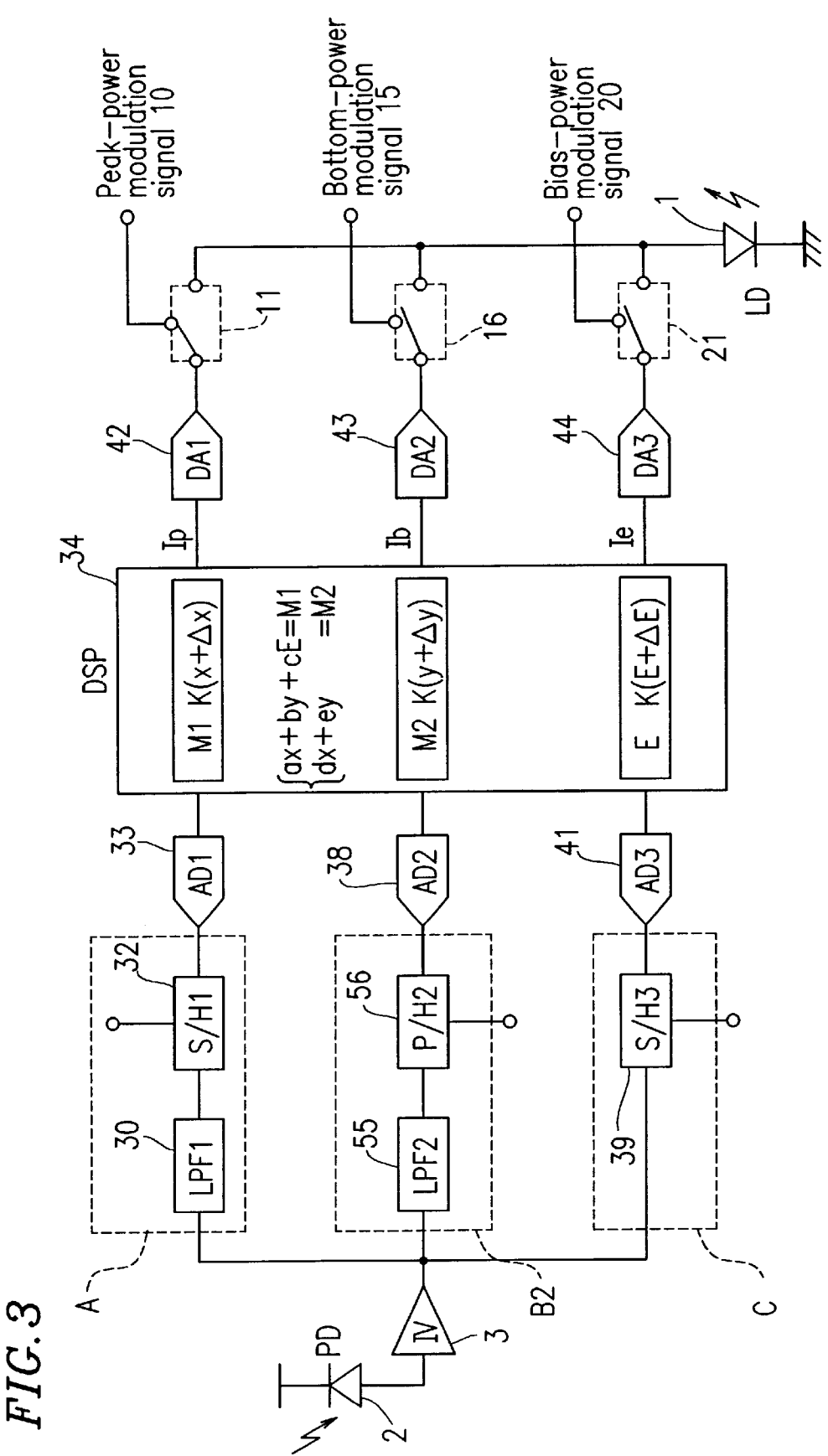
FIG. 3 is a block diagram illustrating a configuration of a semiconductor laser control circuit of Embodiment 2 according to the invention.

FIG. 3 illustrates a configuration of a semiconductor laser control circuit in this embodiment. FIGS. 4(a)–(k) illustrate signal waveforms in main portions of the semiconductor laser control circuit. FIGS. 4(a)–(g), and (k) correspond to FIGS. 2(a)–(g), and (j), respectively, and these illustrate identical signal waveforms.

An important difference between this embodiment and Embodiment 1 resides in that the semiconductor laser control circuit of this embodiment includes a circuit component B2 instead of the circuit component B1.

Hereinafter the configuration of the semiconductor laser control circuit will be described in detail.

An intensity of light pulse emitted from a semiconductor laser 1 is converted into a current signal by a light detector 2. The current signal is converted into a voltage signal by a current-to-voltage converter 3. The voltage signal output from the current-to-voltage converter 3 is input to a circuit component A, a circuit component B2, and a circuit component C in parallel. Configurations of the circuit components A and C are the same as those of the circuit components A and C employed in Embodiment 1. A configuration and a function of the circuit component B2 will be described below in detail.

The circuit component B2 includes a low-pass filter 55 having filter characteristics different from the above-described low-pass filter 36, and a sample-and-hold circuit 56. The sample-and-hold circuit 56 performs its sampling and holding operation for an output of the low-pass filter 55 at a timing when the output of the low-pass filter 55 becomes stable and is converged onto a specific value (an average-value detection timing). An output of the sample-and-hold circuit 56 indicates an average value M2 in a second period of an output of the light detector 2. The output of the sample-and-hold circuit 56 is input into a second AD converter 38, and converted into a digital data signal M2.

The low-pass filter 55 has a cut-off frequency which is higher than the cut-off frequency of the low-pass filter 35 in Embodiment 1. The cut-off frequency of the low-pass filter 35 employed in Embodiment 1 is selected so that an average value is directly obtained from the output. On the other hand, the cut-off frequency of the low-pass filter 55 is selected so that the influence of a leading pulse 145 positioned in a preceding stage of a multi-pulse portion 45 shown in FIG. 4(d) does not extend to the succeeding pulses. In the case where a period of the multi-pulse portion 45 is short, if a cut-off frequency is selected so that an average value is directly obtained from the output of the low-pass filter 55, the influence of the leading pulse 145 varies a detection level of the multi-pulse portion 45. Thus, there is a possibility that the output is disadvantageously shifted from a real average value of the multi-pulse portion 45. Especially when the period of the multi-pulse portion 45 is short, a correct average value cannot be obtained by the influence of the leading pulse 145.

Figure 4:
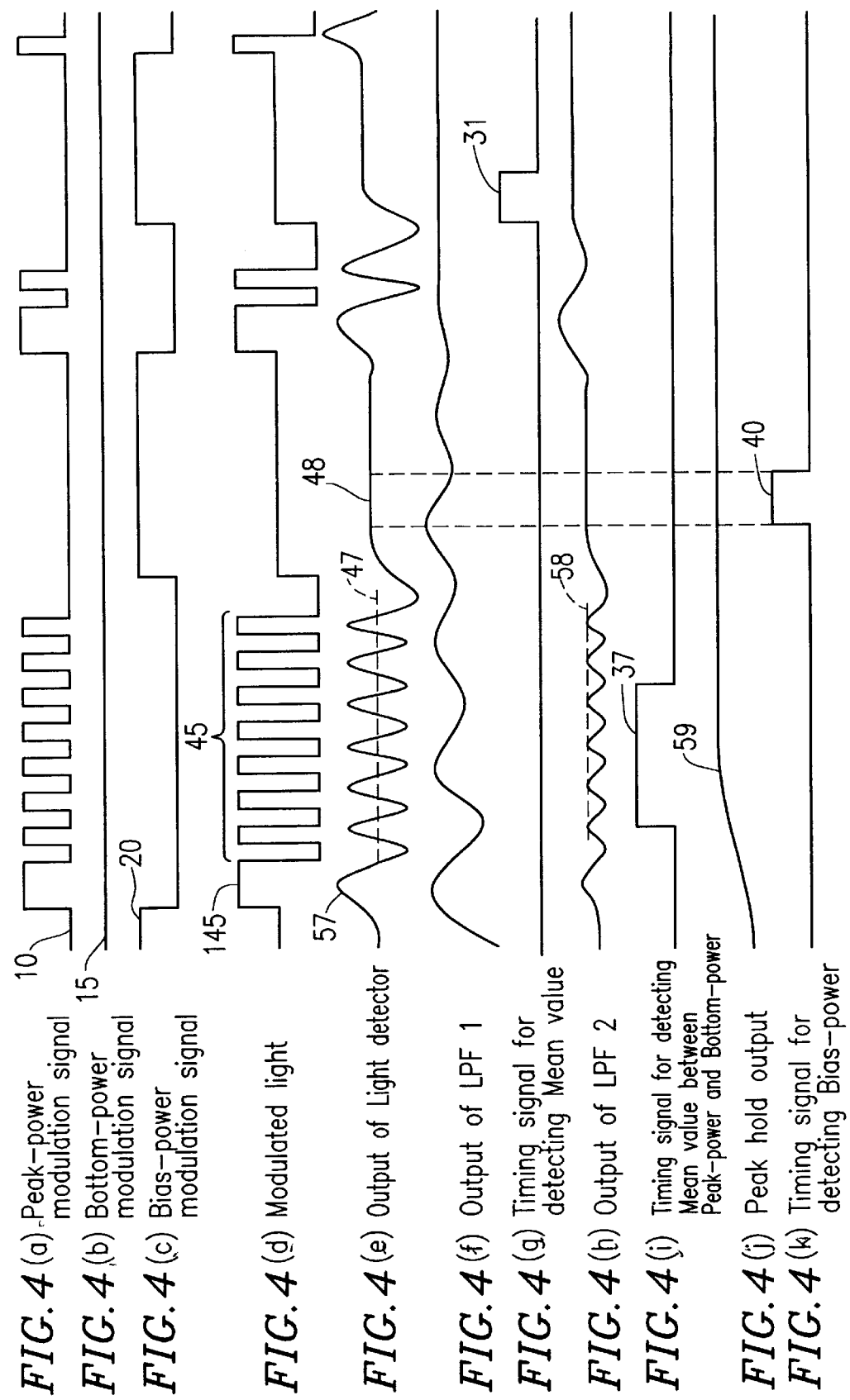
FIGS. 4(a)–(k) illustrate a signal waveform chart of the semiconductor laser control circuit of Embodiment 2.

FIG. 4(h) illustrates the output waveform of the low-pass filter 55. In this embodiment, the cut-off frequency of the low-pass filter 55 is made to be higher, so that levels of a portion corresponding to the leading pulse in the output of the low-pass filter 55 are flattened. As a result, the influence of the portion does not extend to an output wave-form corresponding to the multi-pulse portion 45. In this way, an advantage that the range of design conditions can be expanded as compared with the low-pass filter 35 can be attained.

As shown in FIG. 4(h), a ripple appears in the output waveform of the low-pass filter 55 due to the elevation of the cut-off frequency. In this embodiment, a signal in which the ripple remains is input into a peak hold circuit 56; so as to detect a peak-power of the residual ripple. FIG. 4(i) illustrates a waveform of a timing signal 57 for sampling and holding the output of the low-pass filter 55, when the residual ripple in the output waveform of the low-pass filter 55 becomes stable. The peak holding operation is performed after the ripple of the signal output from the low-pass filter 55 is started to regularly vary, in response to the timing signal 57 in FIG. 4(i).

FIG. 4(j) illustrates an output 59 of a peak hold circuit 56. The magnitude of the output 59 indicates a peak-power 58 of the output of the low-pass filter 55. The detection level is larger than the real average value by the magnitude of the residual ripple amplitude.

An output of the peak hold circuit 56 is input into a second AD converter 38, and converted into digital data. The digital data is input into a signal processor 34. The level of an output 59 of the peak hold circuit 56 is larger than the real average value by the magnitude of the residual ripple amplitude, as described above. For this reason, in order to obtain the real average value, it is sufficient to perform a correction processing in the signal processor 34. As for the correction processing, for example, an output value of the second AD converter 38 may be multiplied by a predetermined numeric value.

The signal processor 34 determines a peak current value Ip, a bottom current value Ib, and a bias current value Ie which are to be supplied to the semiconductor laser 1, and outputs the current data.

In this embodiment, the peak hold circuit 56 is employed. Alternatively, a bottom hold circuit may be employed.

(Embodiment 3)

A third embodiment of the inventive semiconductor laser control circuit will be described with reference to FIG. 5 and FIGS. 6(a) to (k).

Figure 5:
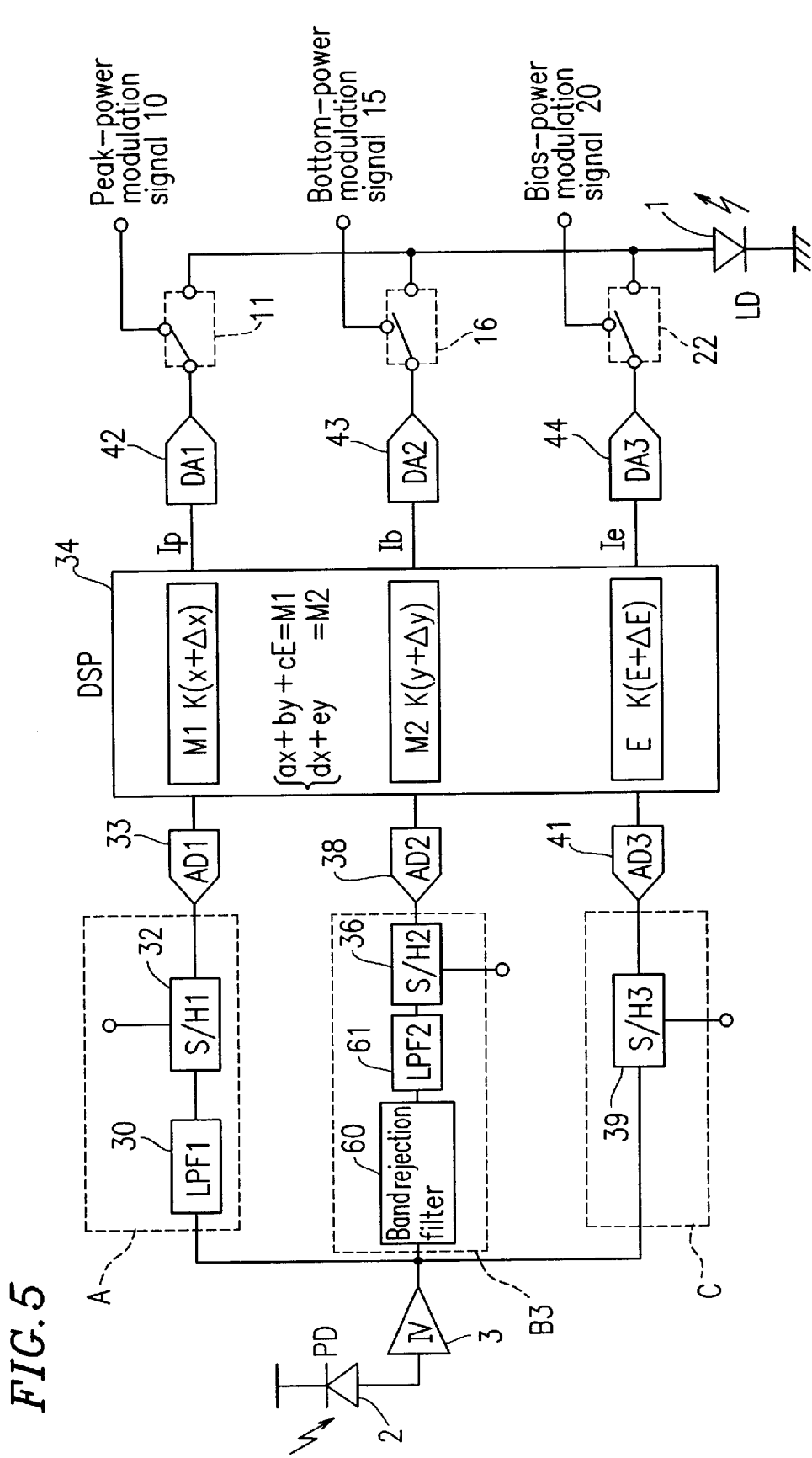
FIG. 5 is a block diagram illustrating a configuration of a semiconductor laser control circuit of Embodiment 3 according to the invention.

FIG. 5 illustrates a configuration of a semiconductor laser control circuit in this embodiment. FIGS. 6(a) to (k) illustrate signal waveforms in main portions of the semiconductor laser control circuit. FIGS. 6(a) to (g), (j), and (k) correspond to FIGS. 2(a) to (g), (i), and (j), respectively, and these illustrate identical signal waveforms.

An important difference between this embodiment and Embodiment 1 resides in that the semiconductor laser control circuit of this embodiment includes a circuit component B3 instead of the circuit component B1.

Hereinafter the configuration of the semiconductor laser control circuit will be described in detail.

An intensity of light pulse emitted from a semiconductor laser 1 is converted into a current signal by a light detector 2. The current signal is converted into a voltage signal by a current-to-voltage converter 3. The voltage signal output from the current-to-voltage converter 3 is input to a circuit component A, a circuit component B3, and a circuit component C in parallel. Configurations of the circuit components A and C are the same as those of the circuit components A and C employed in Embodiment 1. A configuration and a function of the circuit component B3 will be described below in detail.

The circuit component B3 includes a band-stop filter 60, a low-pass filter 61, and a sample-and-hold circuit 36. The sample-and-hold circuit 36 performs its sampling and holding operation for an output of the low-pass filter 61 at a timing when the output of the low-pass filter 61 becomes stable and is converged onto a specific value. An output of the sample-and-hold circuit 36 indicates an average value M2 in a second period of an output of the light detector 2. The output of the sample-and-hold circuit 36 is input into a second AD converter 38, and converted into a digital data signal M2.

Figure 6:
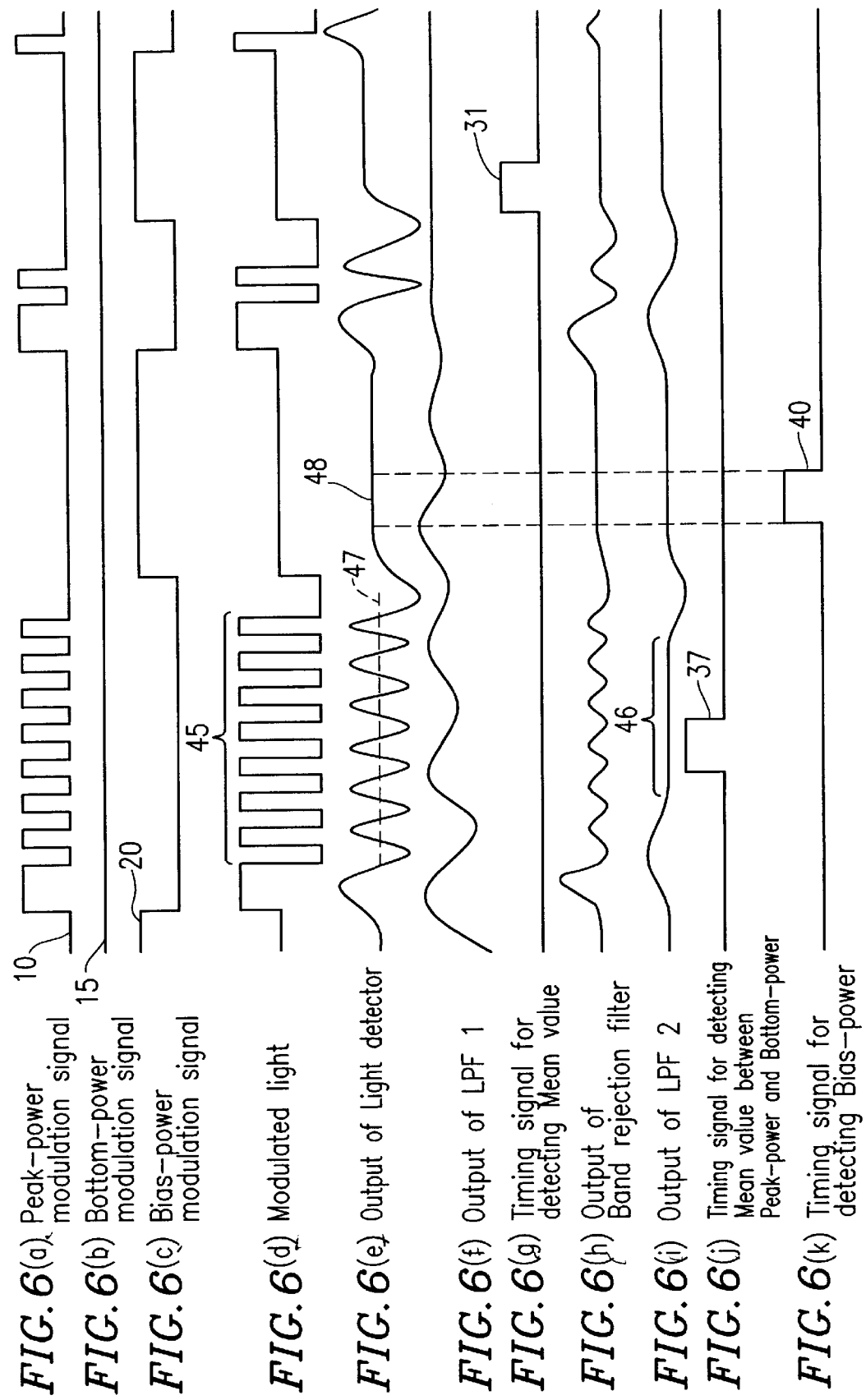
FIGS. 6(a)–(k) illustrate a signal waveform chart of the semiconductor laser control circuit of Embodiment 3.

A multi-pulse portion 45 in the signal waveform shown in FIG. 6(d) has a waveform in which pulses repetitively appear. When the voltage signal output from the current-to-voltage converter 3 is input into the band-stop filter 60 for removing a band including the repetitive frequency, a signal output from the band-stop filter 60 is ideally smoothed, so as to obtain an average value of the multi-pulse portion 45.

Because of constraints of design conditions in the band-stop filter 60, it is difficult to obtain an average-value output which is perfectly flattened, so that a ripple may remain in the output waveform. The residual ripple has a relatively small amplitude, so that the residual ripples can be easily removed by a low-pass filter with a lower order and a simple configuration. Thus, an average value of the flattened multi-pulse portion 45 can be obtained.

FIG. 6(h) shows an output waveform of the band-stop filter 60. The band-stop filter 60 removes a band component of the repetitive frequency of a portion corresponding to the multi-pulse portion 45 of FIG. 6(d) in a signal shown in FIG. 6(e). In the output of the band-stop filter 60, the repetitive waveform portion of the input signal is attenuated, but is not perfectly removed, so that a ripple appears.

FIG. 6(i) shows an output waveform of the low-pass filter 61. The low-pass filter 61 is designed so as to remove the residual ripple. Since the amplitude of the residual ripple is relatively small, the low-pass filter 61 has a lower order and a simple configuration. As apparent from FIG. 6(i), the output of the low-pass filter 61 includes a portion 46 in which the residual ripple is removed and flattened. The level of this portion 46 corresponds to an average-value level 47 between the peak-power and the bottom-power shown in FIG. 6(e).

FIG. 6(j) shows a waveform of a timing signal 37 for sampling and holding the output of the low-pass filter 61, when a flat portion 46 appears in the output of the low-pass filter 61. An output of the sample-and-hold circuit 36 is input into a second AD converter 38, and converted into digital data. The digital data is input into a signal processor 34.

The signal processor 34 determines a peak current value Ip, a bottom current value Ib, and a bias current value Ie which are to be supplied to the semiconductor laser 1 by the same operations as described above, and outputs the current data.

(Embodiment 4)

A fourth embodiment of the inventive semiconductor laser control circuit will be described with reference to FIG. 7 and FIGS. 8(a) to (k).

Figure 7:
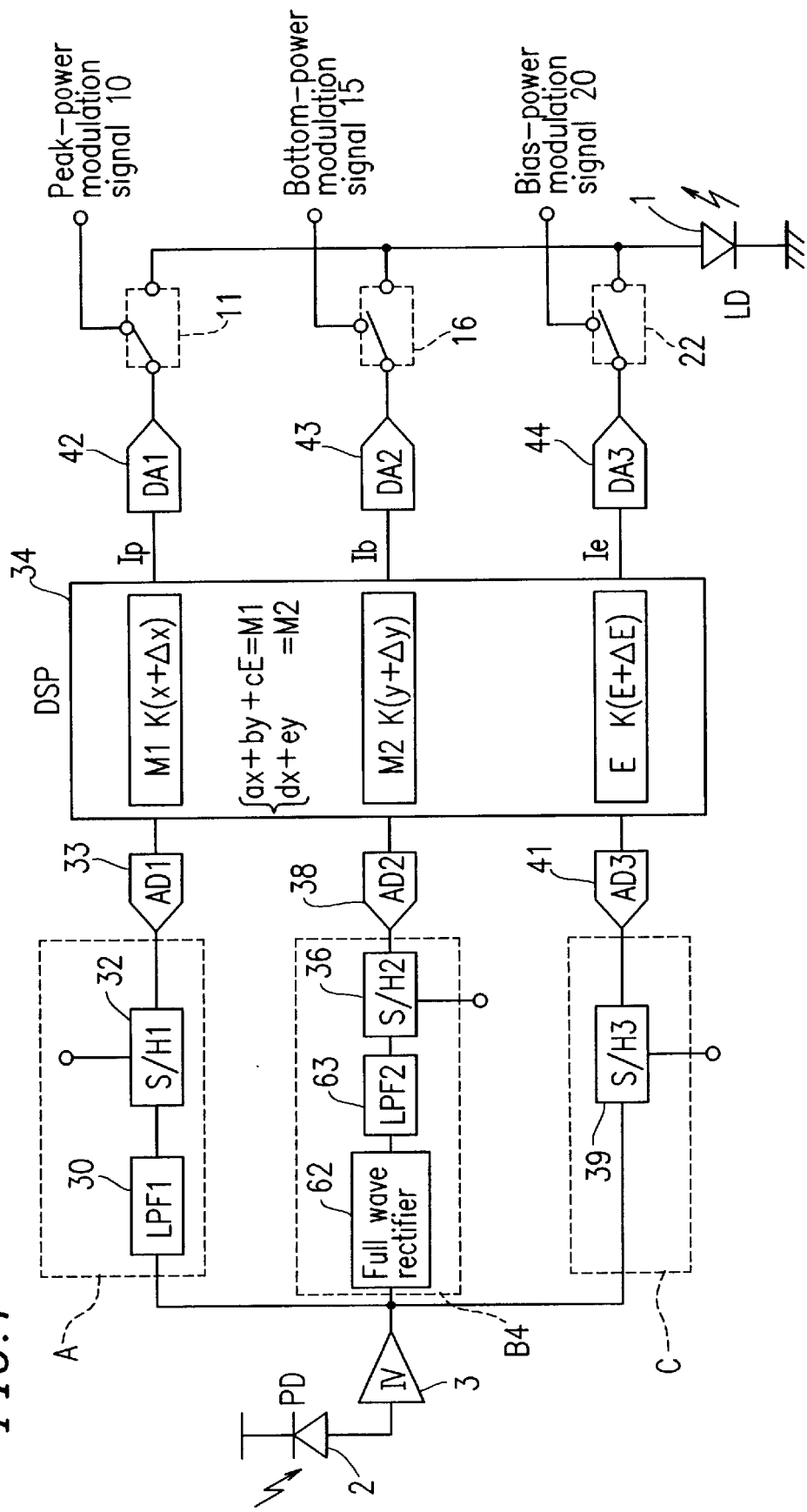
FIG. 7 is a block diagram illustrating a configuration of a semiconductor laser control circuit of Embodiment 4 according to the invention.

FIG. 7 illustrates a configuration of a semiconductor laser control circuit in this embodiment. FIGS. 8(a)–(k) illustrate signal waveforms in main portions of the semiconductor laser control circuit. FIGS. 8(a)–(g), and (k) correspond to FIGS. 6(a)–(g), and (k), respectively, and these illustrate identical signal waveforms.

An important difference between this embodiment and Embodiment 3 resides in that the semiconductor laser control circuit of this embodiment includes a circuit component B4 instead of the circuit component B3.

Hereinafter the configuration of the semiconductor laser control circuit will be described in detail.

An intensity of light pulse emitted from a semiconductor laser 1 is converted into a current signal by a light detector 2. The current signal is converted into a voltage signal by a current-to-voltage converter 3. The voltage signal output from the current-to-voltage converter 3 is input to a circuit component A, a circuit component B4, and a circuit component C in parallel. Configurations of the circuit components A and C are the same as those of the circuit components A and C employed in Embodiment 1. A configuration and a function of the circuit component B4 will be described below in detail.

The circuit component B4 includes a full wave rectifier 62, a low-pass filter 63, and a sample-and-hold circuit 36. The sample-and-hold circuit 36 performs its sampling and holding operation at a timing when an output of the low-pass filter 63 becomes stable and is converged onto a specific value. An output of the sample-and-hold circuit 36 indicates an average value M2 in a second period of the output of the light detector 2. The output of the sample-and-hold circuit 36 is input into a second AD converter 38, and converted into a digital data signal M2.

Figure 8:
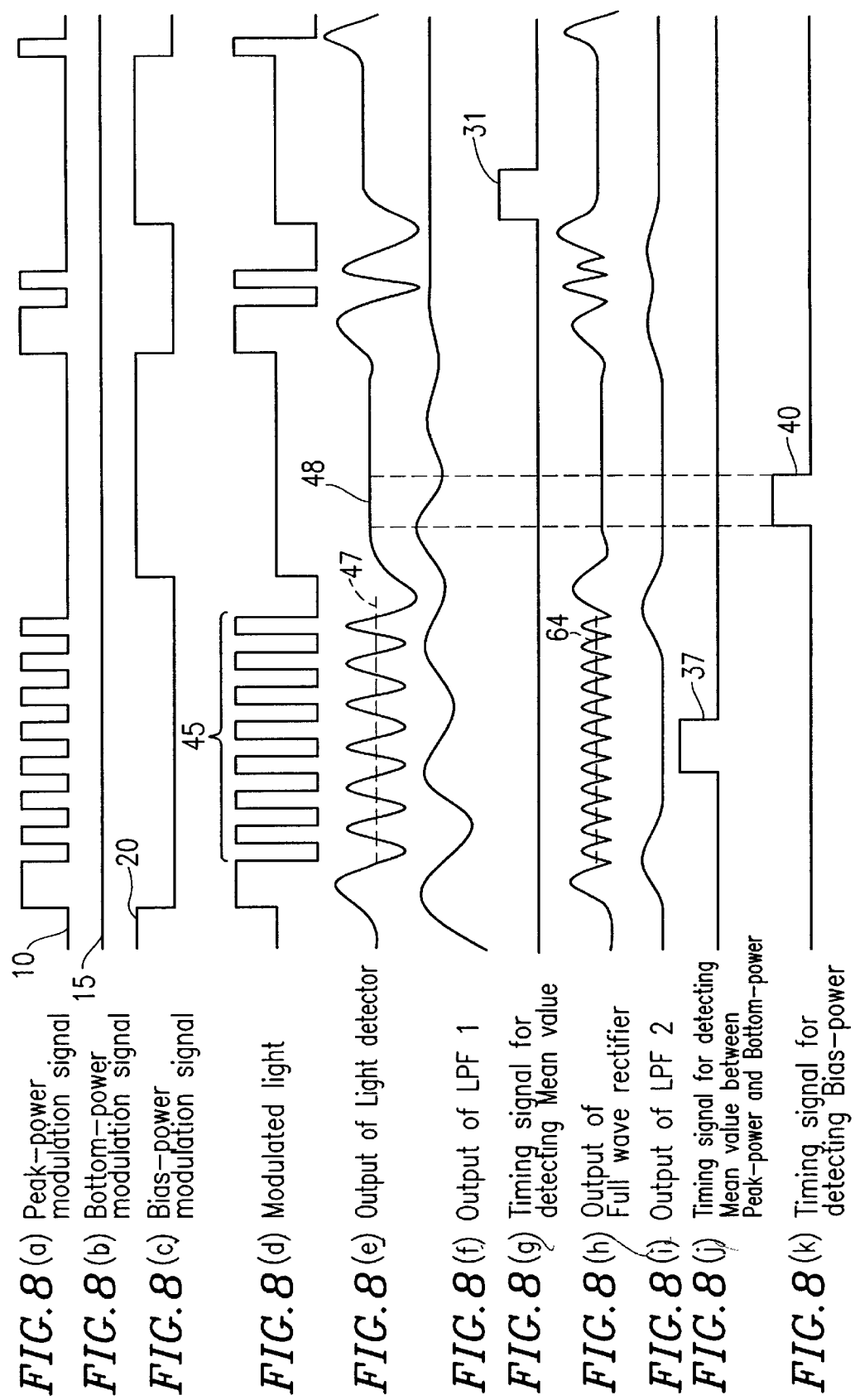
FIGS. 8(a)–(k) illustrate a signal waveform chart of the semiconductor laser control circuit of Embodiment 4.
Figure 9:
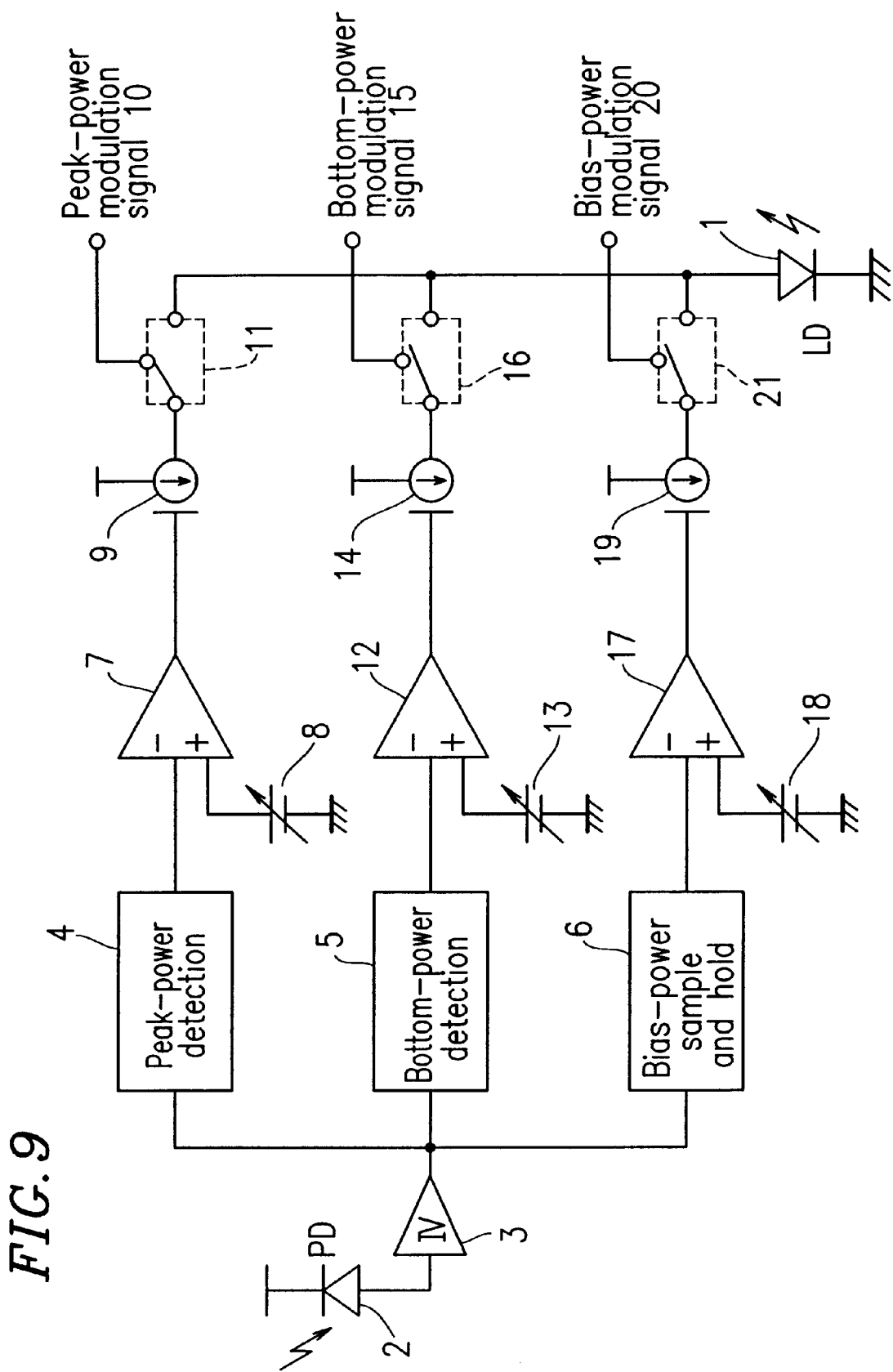
FIG. 9 is a block diagram illustrating a configuration of a prior-art semiconductor laser control circuit.
Figure 10:
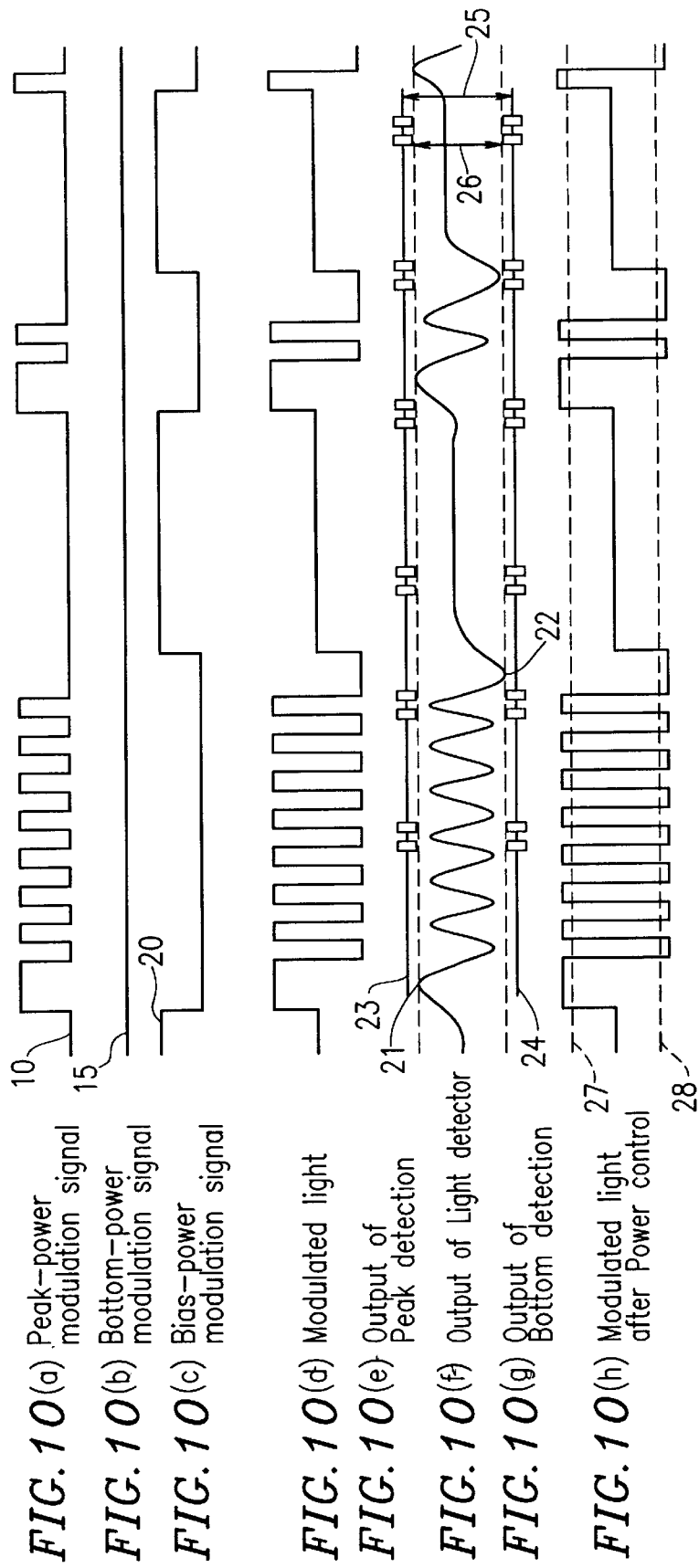
FIGS. 10(a)–(h) illustrate a signal waveform chart of the prior art semiconductor laser control circuit.

The multi-pulse portion 45 in the signal waveform shown in FIG. 8(d) has a waveform in which pulses repetitively appear. When the signal of FIG. 8(e) is input into the full wave rectifier 62, a signal having a waveform shown in FIG. 8(h) is output from the full wave rectifier 62.

As described above, when a target value (a set reference value) of a peak-power level is Vp, a target value (a set reference value) of a bottom-power level is Vb, and a target value (a set reference value) of a bias-power level is Ve, a voltage ($M2_{ref}$) corresponding to the average value M2 of the peak-power and the bottom-power is applied to the full wave rectifier 62 as a reference voltage. The voltage ($M2_{ref}$) is represented by the following equation:

$$M2_{ref} = a \cdot Vp + b \cdot Vb + c \cdot Ve \qquad \text{(Equation 11)}$$

According to the embodiment, the full wave rectifier 62 converts the input signal of the multi-pulse portion 45 into a signal having a double frequency and a half amplitude. As a result, as compared with the case where the full wave rectifying is not performed, it is possible to perform sufficient smoothing by using a low-pass filter of a simple configuration.

FIG. 8(i) shows an output waveform of the low-pass filter 63. The low-pass filter 63 is designed so as to remove higher frequency components appearing in the output of the full wave rectifier 62.

FIG. 8(j) shows a waveform of the timing signal 37 for sampling and holding the output of the low-pass filter 63 after the output thereof becomes stable. The output of the sample-and-hold circuit 36 is input into a second AD converter 38, and converted into digital data. The digital data is input into a signal processor 34.

The signal processor 34 determines a peak current value Ip, a bottom current value Ib, and a bias current value Ie which are to be supplied to the semiconductor laser 1 by the same operations as described above, and outputs current data.

(Embodiment 5)

In the above-described embodiments, laser radiation which is modulated between three-value levels shown in FIG. 2(d), for example, is output, but the invention is not limited to this. For example, the invention can be applied to a case where laser radiation which is modulated between two-value levels is output.

Figure 12:
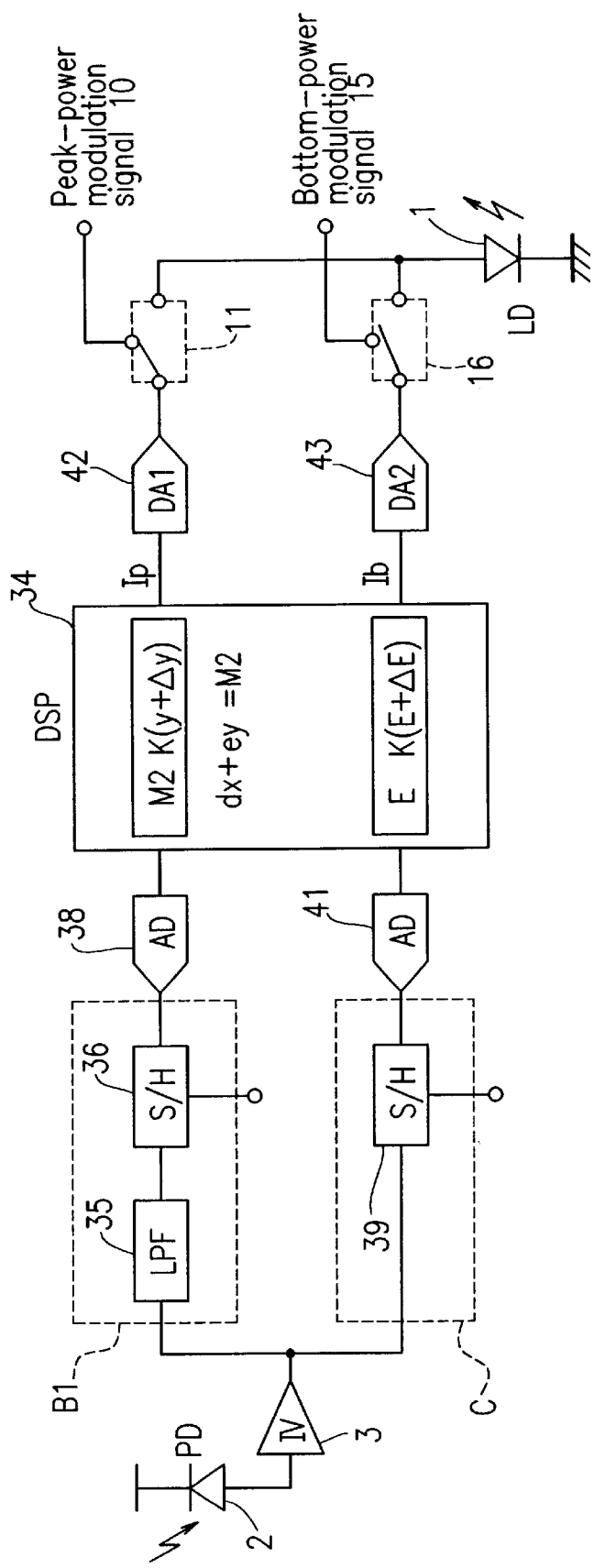
FIG. 12 is a configuration of a semiconductor laser control circuit of Embodiment 5 according to the invention.

Hereinafter a fifth embodiment of the inventive semiconductor laser control circuit will be described with reference to FIG. 12.

The semiconductor laser control circuit of this embodiment controls a driving current of a semiconductor laser, and modulates an intensity of light emitted from the semiconductor laser between two set levels including a first level (a peak-power level) and a second level (a bottom-power level). In other words, the bias-power level in the above-described embodiments is made to be equal to the bottom-power level.

Figure 13:
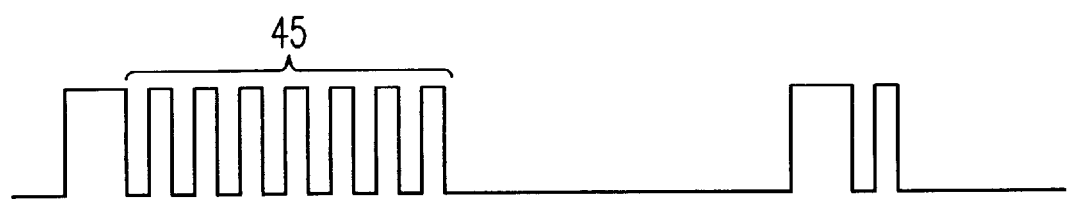
FIG. 13 is a signal waveform of the modulated light produced by the semiconductor laser control circuit of Embodiment 4.

A waveform of an output light power level of a semiconductor laser 1 in this embodiment is shown in FIG. 13. FIG. 13 shows a period in which an optical power of the laser light is modulated between a peak-power level and a bottom-power level for mark writing (a period in which a multi-pulse portion 45 is generated), and a certain period into including a period in which the light power is maintained at the bottom-power level for forming a space positioned between marks. In this embodiment, a write-once storage medium.

In this embodiment, the modulation between two-value levels is performed, so that is the bottom-power level can be detected by the same method as the method by which the bias-power is detected in the above-described embodiments. If the bottom-power level is known, the bottom-power-level can be obtained by a simpler operation from the output of the circuit component B1. Specifically, in this embodiment, it is sufficient to solve the following equations. Since the reference letter y indicating the bottom-power level is known, only the reference letter x is unknown.

$$d+e=1 \quad \text{(Equation 12)(=Equation 3)}$$

$$dx+ey=M2 \quad \text{(Equation 13)(=Equation 4)}$$

Accordingly, in this embodiment, the peak-power level is determined by a simpler operation than the operation performed by the above-described embodiments.

Hereinafter the configuration of the semiconductor laser control circuit will be described in detail.

The semiconductor laser control circuit includes a circuit component B1 for generating a signal indicating an average value of light intensities actually detected by a light detector 2 in a period in which the light power level is modulated between the peak-power level and the bottom-power level, and a circuit component C for generating a signal indicating a light power level actually detected by the light detector 2 in a period in which the light power level is to be maintained at the bottom-power level.

The configurations and the operations of the circuit component B1 and the circuit component C are the same as those described above in the aforementioned embodiments. An output of the circuit component B1 is input into an AD converter 38, and converted into a digital data signal M2. The digital data signal M2 is input into a signal processor 34. An output of the circuit component C (a sample-and-hold circuit 39) is input into an AD converter 41, and converted into a digital data signal E. The digital data signal E is also input into the signal processor 34.

In this embodiment, based on the two kinds of signals M2 and E, the laser light intensities at the bottom-power level and the bottom-power level are obtained by the signal processor (DSP) 34. The laser light power level is adjusted based on the output of the signal processor 34.

In this embodiment, the circuit component B1 in Embodiment 1 is adopted. Instead of the circuit component B1, the circuits B2 to B4 can be adopted.

As described above, according to the embodiments of the invention, the peak-power level and/or the bottom-power level can be obtained by arithmetic operations based on the light power level detected in the period in which a mark is written by a high-speed modulated light pulse. As a result, even if the high-frequency response of the light detector is insufficient, the output power of the semiconductor laser can be controlled with high precision.

In the above-described embodiments, appropriate correcting operation is performed for data input into the signal processor 38 from the first AD converter 33, the second AD converter 38, and the third AD converter 41, whereby offset voltage correction of a low-pass filter and a sample-and-hold circuit, correction of frequency characteristics, removing of a residual ripple, or the like may be performed.

According to the invention, even if the frequency characteristics of a light detector for monitoring an intensity of high-speed modulated laser radiation are insufficient, an average value of laser light intensities measured by the light detector in a selected period is detected, so that the peak-power and the bottom-power of the laser light power level can be obtained by operation. According to the invention, based on the thus-obtained peak-power and the bottom-power of the modulated laser light power level, the peak-power and the bottom-power of the laser radiation can be accurately controlled to predetermined levels.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor laser control circuit which can modulate a light power level among a plurality of set levels including a first level, a second level lower than the first level, and a third level lower than the first level but higher than the second level, the semiconductor laser control circuit comprising:

a first circuit portion for generating a first signal based on a light power level actually detected by a light detector in a first period in which a light power level of laser radiation is to be modulated among the first level, the second level, and the third level;

a second circuit portion for generating a second signal based on a light power level actually detected by the light detector in a second period in which a light power level of the laser radiation is to be modulated between the first level and the second level;

a third circuit portion for generating a third signal based on a light power level actually detected by the light detector in a third period in which the light power level of the laser radiation is to be at the third level;

a processor for calculating a light power level of the first level and a light power level of the second level based on the first through third signals; and a fourth circuit portion for adjusting the light power level based on an output of the processor.

2. A semiconductor laser control circuit according to claim 1, wherein the first signal exhibits a value represented by an expression of ax+by+cE=M1, when a probability of laser radiation having a light power level x at the first level actually detected by the light detector in the first period is designated by a, a probability of laser radiation having a light power level y at the second level is designated by b, and a probability of laser radiation having a light power level E at the third level is designated by c.

3. A semiconductor laser control circuit according to claim 2, wherein the second signal exhibits a value represented by an expression of dx+ey=M2 when a probability of laser radiation having a light power level x at the first level actually detected by the light detector in the second period is designated by d, and a probability of laser radiation having a light power level y at the second level is designated by e.

4. A semiconductor laser control circuit according to 3, wherein the third signal exhibits a light power level E at the third level actually detected by the light detector in the third period.

5. A semiconductor laser control circuit according to claim 1, wherein the first circuit portion receives an output of the light detector, and generates a signal corresponding to an average value of the output in the first period as the first signal.

6. A semiconductor laser control circuit according to 5, wherein the first circuit portion includes a first low-pass filter having a selected cut-off frequency.

7. A semiconductor laser control circuit according to claim 6, wherein the first circuit portion includes a sample-and-hold circuit for holding an output of the first low-pass filter at a selected timing.

8. A semiconductor laser control circuit according claim 1, wherein the second circuit portion receives an output of the light detector, and generates a signal corresponding to an average value of the output in the second period as the second signal.

9. A semiconductor laser control circuit according to claim 8, wherein the second circuit portion includes:

a second low-pass filter having a selected cut-off frequency; and a sample-and-hold circuit for holding an output of the second low-pass filter at a selected timing.

10. A semiconductor laser control circuit according to any claim 1 wherein the third circuit portion includes a sample-and-hold circuit for holding an output of the light detector at a selected timing.

11. A semiconductor laser control circuit according to claim 8, wherein the second circuit portion includes:

a second low-pass filter having a selected cut-off frequency; and a peak hold circuit for holding a peak-power in an output of the second low-pass filter only for a selected period.

12. A semiconductor laser control circuit according to claim 9, further comprising a band-stop filter in a preceding stage of the second low-pass filter.

13. A semiconductor laser control circuit according to claim 9, further comprising a full wave rectifier in a preceding stage of the second low-pass filter.

14. A semiconductor laser control circuit which can modulate a light power level between a first level and a second level lower than the first level, the semiconductor laser control circuit comprising:

a first circuit portion for generating a signal indicating an average value of light intensities actually detected by a light detector in a period in which a light power level is to be modulated between the first level and the second level;

a second circuit portion for generating a signal indicating a light power level actually detected by the light detector in a period in which the light power level is to be at the second level;

a processor for calculating a light power level of the first level based on the two signals; and a third circuit portion for adjusting the light power level based on an output of the processor.

15. A semiconductor laser control circuit according to claim 14, wherein the signal indicating the average value exhibits a value represented by an expression of dx+ey=M2, when a probability of laser radiation having a light power level x of the first level actually detected by the light detector in the period in which the light power level is to be modulated between the first level and the second level is designated by d, and a probability of laser radiation having a light power level y of the second level is designated by e.

16. A semiconductor laser control circuit according to claim 14 wherein the first circuit portion includes:

a low-pass filter having a selected cut-off frequency; and a sample-and-hold circuit for holding an output of the low-pass filter at a selected timing.

17. A semiconductor laser control circuit according to claim 14, wherein the second circuit portion includes a sample-and-hold circuit for holding an output of the light detector at a selected timing.

18. A laser light source comprising:

a semiconductor laser control circuit according to claim 1 and a semiconductor laser driven by the control circuit.

19. An apparatus comprising:

a semiconductor laser control circuit according to claim 1 a semiconductor laser driven by the control circuit; and an optical system for irradiating a recording medium with laser radiation emitted from the semiconductor laser.

20. An apparatus according to claim 19, wherein information can be recorded on the recording medium.

* * * * *